(12) United States Patent
Takahashi et al.

(10) Patent No.: US 6,869,752 B2
(45) Date of Patent: *Mar. 22, 2005

(54) METHOD OF MANUFACTURING SEMICONDUCTOR DEVICE HAVING SOI STRUCTURE

(75) Inventors: Akira Takahashi, Tokyo (JP); Kousuke Hara, Tokyo (JP); Motoki Kobayashi, Tokyo (JP); Jun Kanamori, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 1 day.

This patent is subject to a terminal disclaimer.

(21) Appl. No.: 10/288,415

(22) Filed: Nov. 6, 2002

(65) Prior Publication Data

US 2003/0186173 A1 Oct. 2, 2003

(30) Foreign Application Priority Data

Mar. 28, 2002 (JP) ........................................ 2002-091222

(51) Int. Cl.⁷ .............................. G03F 7/00; G03F 7/36
(52) U.S. Cl. .................... 430/319; 430/311; 430/313; 430/314; 430/316; 430/317; 430/330; 216/67
(58) Field of Search ................................ 430/311, 313, 430/314, 316, 317, 319, 330; 216/67

(56) References Cited

U.S. PATENT DOCUMENTS

| | | | |
|---|---|---|---|
| 5,468,340 A | 11/1995 | Gupta et al. ................. 216/67 |
| 6,200,735 B1 * | 3/2001 | Ikegami ....................... 430/314 |
| 6,340,829 B1 | 1/2002 | Hirano et al. ................ 257/347 |
| 6,380,578 B1 * | 4/2002 | Kunikiyo ...................... 257/301 |
| 6,458,516 B1 * | 10/2002 | Ye et al. ...................... 430/317 |
| 6,548,900 B1 | 4/2003 | Kusumi ....................... 257/758 |
| 6,624,010 B2 * | 9/2003 | Ikegami ....................... 438/149 |

FOREIGN PATENT DOCUMENTS

| | | |
|---|---|---|
| JP | 7-193057 | 7/1995 |
| JP | 11-317527 | 11/1999 |
| JP | 11-354499 | 12/1999 |
| JP | 2000-311939 | 11/2000 |
| JP | 2001-267576 | 9/2001 |

\* cited by examiner

Primary Examiner—Mark F. Huff
Assistant Examiner—Nicole Barreca
(74) Attorney, Agent, or Firm—Volentine Francos & Whitt, PLLC

(57) ABSTRACT

The present invention aims to provide a method of manufacturing a semiconductor device having an SOI structure, which is capable of setting an etching process so as to cause contact etching to widely have a process margin even in a semiconductor elemental device using an extra-thin SOI layer. The present method is a method of manufacturing a fully depleted-SOI device. A cobalt layer is formed on an SOI layer. Cobalt is transformed into a cobalt silicide layer by heat treatment. An interlayer insulating film is formed on the cobalt silicide layer, and a contact hole is defined in the interlayer insulating film by dry etching. As an etching gas used in such a dry etching step, a CHF3/CO gas is used. An etching condition is set through the use of a dry etching rate held substantially constant by use of the etching gas. Described specifically, etching time is suitable set.

21 Claims, 5 Drawing Sheets

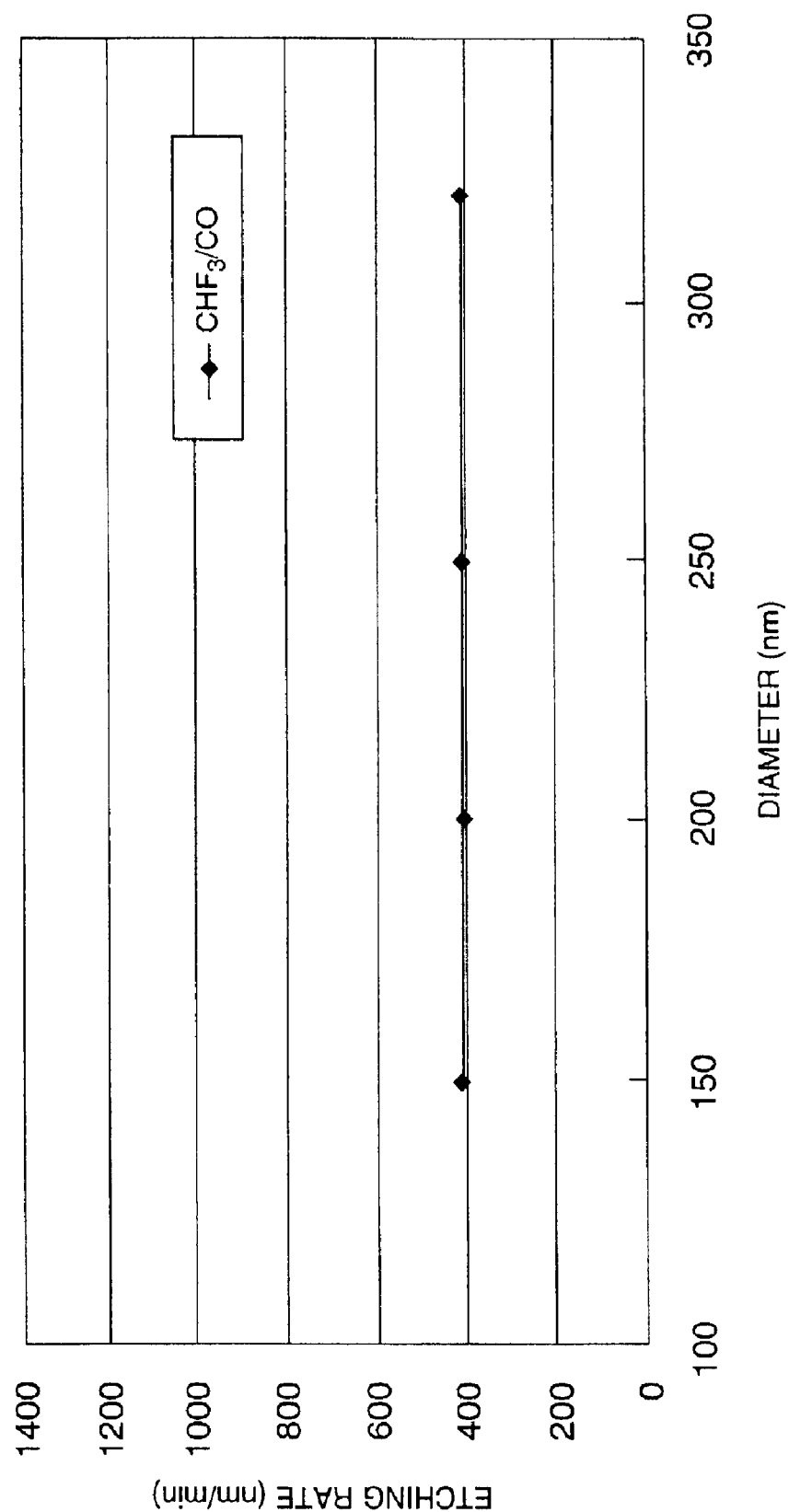

METHOD OF MANUFACTURING SEMICONDUCTOR DEVICE HAVING SOI STRUCTURE

BACKGROUND OF THE INVENTION

1. Field of the Invention

The present invention relates to a method of manufacturing a semiconductor device having an SOI structure, and particularly to a dry etching method effective when a contact hole for a fully depleted-SOI device is defined.

2. Description of the Related Art

In recent years, attention has been given to a fully depleted-SOI device in that it can be expected to yield speeding-up and low power consumption.

In order to implement a fully depleted-SOI device having a micro or extremely small gate length, there is a need to increase the concentration of an impurity in a channel region, restrain the extension of a depletion layer from each of source and drain regions, and increase a charge share coefficient to thereby suppress a short channel effect. On the other hand, since the spread of a depletion layer placed under a gate electrode becomes narrow when the concentration of the impurity in the channel region is increased, it is necessary to thin the thickness of an SOI layer for the purpose of execution of a fully-depleted operation. When the gate length is 200 nm or less, the thickness of the SOI layer must be thinned to 20 nm to 50 nm. Therefore, a source resistance and a drain resistance increase and hence transistor characteristics are deteriorated.

As a method of reducing the source resistance and the drain resistance, for example, a salicide process for depositing a high melting-point metal like titanium or cobalt on a source/drain region and selectively forming a metal silicide layer by heat treatment has been used.

Since, however, the thickness of the SOI layer is thinned to about 20 nm to about 50 nm as described above and consequently the amount of silicon per se consumed by reaction with the high melting-point metal upon the salicide process falls short, the aggregation of metal silicide occurs and hence a metal silicide-free portion, i.e., a concave portion is yielded. When a contact hole is defined in such a form that the concave portion and the contact hole are brought into alignment with each other, the concave portion will cause a fault in that etching is not successfully stopped at the concave portion, and a buried oxide film placed under the silicide layer is also etched. If even the buried oxide film is etched, then a silicon substrate and each wiring are short-circuited to thereby cause a defect important to the SOI device. Such a fault will increase along with the thinning of the SOI layer with accelerating speed.

SUMMARY OF THE INVENTION

The present invention aims particularly to provide a method of manufacturing a semiconductor device having an SOI structure, which includes such a dry etching step as not to effect etching up to a buried oxide film even in the case of the presence of a concave portion formed by silicide aggregation at the bottom of a contact hole in the process of defining the contact hole in an SOI layer having an extra-thin thickness while a contact hole defining step is being satisfied, as in a fully depleted-SOI device.

In order to solve the above problem, the present invention provides a method of manufacturing a semiconductor device having an SOI structure, comprising:

forming a high melting-point metal on an SOI layer, transforming a layer of the high melting-point metal into a metal silicide layer by heat treatment, forming an interlayer insulating film on the metal silicide layer, and defining a contact hole in the interlayer insulating film by dry etching, wherein the dry etching is performed using a CHF3/CO gas.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 5 is a diagram illustrating the diameter of a contact hole and an etching rate where two types of dry etching gases are used.

DETAILED DESCRIPTION OF THE PREFERRED EMBODIMENTS

A salicide step and a contact hole forming step in a process for manufacturing a fully depleted-SOI device will be described using FIG. 1 to provide easy understanding of a method of manufacturing a semiconductor device having an SOI structure, according to the present invention.

Figure 1A:
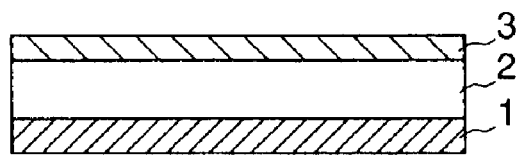
FIG. 1 is a sectional process diagram for describing an embodiment showing a method of manufacturing a semiconductor device having an SOI structure, according to the present invention.

As shown in FIG. 1(a), an SOI layer 3 insulated and, separated by a buried oxide film 2 is formed so as to be disposed on a silicon substrate 1. A so-called SOI substrate is prepared. Either a lamination method or an SIMOX method may form this SOI substrate. Now the SOI layer 3 is formed so as to have a thickness of 25 nm, for example. Although not shown in the drawing, a transistor comprised of a gate electrode, a source region and a drain region is formed in an element forming area provided in the SOI layer 3. A further description will be advanced assuming that the SOI layer 3 placed in process-step drawings subsequent to FIG. 1(a) corresponds to the drain region, while the description of the salicide step and the contact hole forming step are being taken into consideration as described above.

Figure 1B:
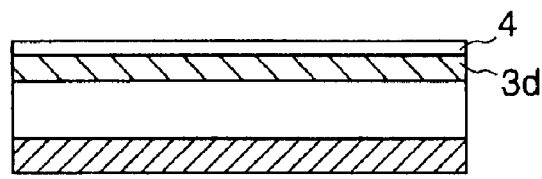

As shown in FIG. 1(b), cobalt 4 is formed, as a high melting-point metal, over the whole surface of the SOI layer 3 containing an SOI layer 3d (hereinafter called SOI layer 3d) corresponding to the drain region.

Figure 1C:
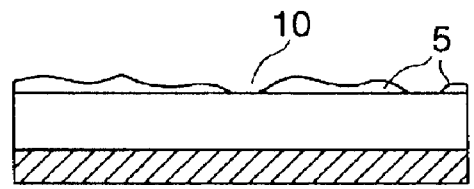

As shown in FIG. 1(c), the cobalt 4 and silicon of the SOI layer 3d react with each other by heat treatment at a temperature of about 800° C. so that a metal silicide layer 5 is formed. While the metal silicide layer 5 has been mentioned previously, it is formed to reduce a source resistance and a drain resistance.

Figure 1D:
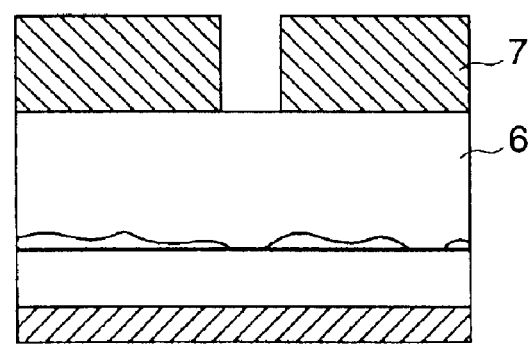

As shown in FIG. 1(d), an $SiO_2$ film is formed on the metal silicide layer 5 as an interlayer insulating film 6. Next, a contact hole for connecting each wiring is defined in the drain region of the SOI layer 3d. A resist pattern 7, which serves as an etching mask for defining a contact hole, is first formed on the interlayer insulating film 6.

Figure 1E:
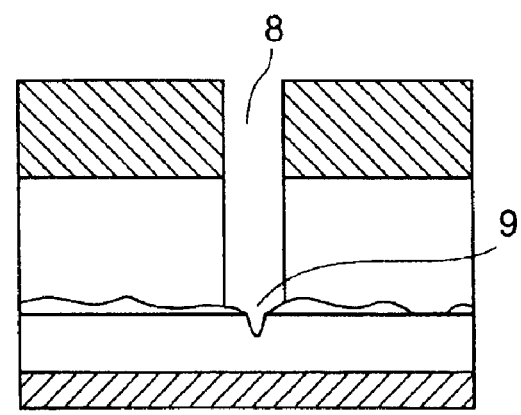

As shown in FIG. 1(e), a contact hole 8 is defined in the interlayer insulating film 6 by use of the resist pattern 7 serving as the etching mask. A matter desired to be described herein is as follows. When the amount of silicon per se consumed by reaction with the cobalt corresponding to the high melting-point metal upon the salicide step falls short, the metal silicide is aggregated so that a metal silicide-free portion, i.e., such a concave portion 10 (see FIG. 1(c)) as to expose the buried oxide film 2 is formed. Since the interlayer insulating film 6 and the buried oxide film 2 are formed of substantially the same material where the contact hole 8 is defined above such a concave portion 10 as to expose the buried oxide film 2, there is no etching selectivity between the two, and hence an etching removed portion 9 is formed in the buried oxide film 2. As the case may be, an etching removed portion might be formed to such an extent as to penetrate the buried oxide film 2.

An object of the present invention is particularly to establish such a dry etching step as not to effect etching up to the buried oxide film even in the case of the presence of a concave portion formed by silicide aggregation at the bottom of a contact hole in the process of defining the contact hole in an SOI layer having an extra-thin thickness while a contact hole defining step is being-satisfied, as in a fully depleted-SOI device.

In order to achieve the above object, how to form a concave portion by silicide aggregation when the thicknesses of an SOI layer and a cobalt layer are respectively changed, was first measured.

Figure 2:
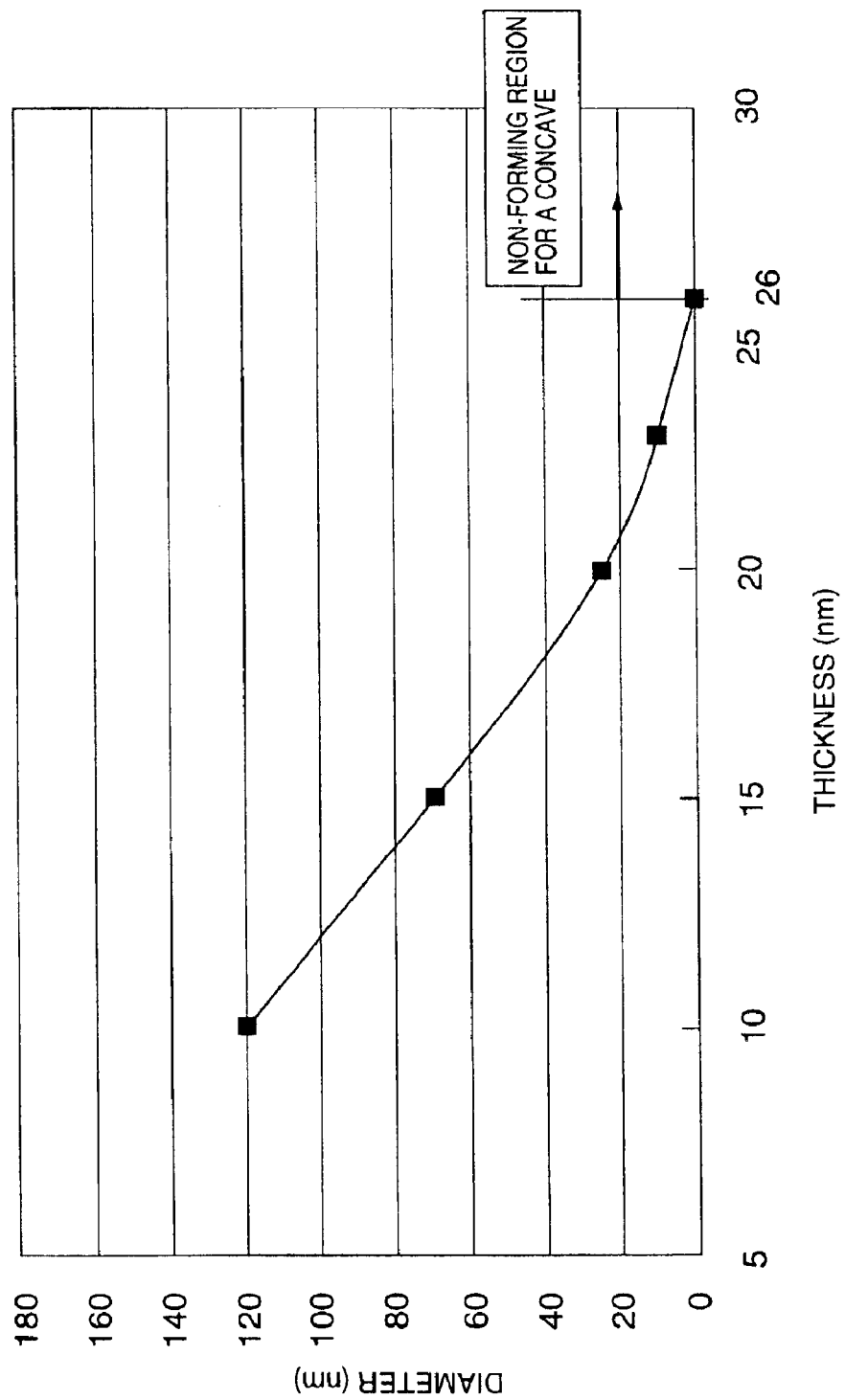
FIG. 2 is a diagram illustrating the relationship between the thickness of an SOI layer and the diameter of a concave portion formed by silicide aggregation.

FIG. 2 is a diagram showing the relationship between the thickness of the SOI layer and the diameter of the concave portion formed by the silicide aggregation. When the thickness of the SOI layer increases from 26 nm with 26 nm as the boundary, no concave portion due to the silicide aggregation occurs as is apparent from FIG. 2. The diameter of the concave portion starts to increase in the direction in which the thickness of the SOI layer becomes thin from 26 nm. When the thickness of the SOI layer is 10 nm, the diameter of the concave portion shows a maximum value of 120 nm.

The ratio between the thicknesses of the SOI layer and the cobalt layer is normally given as SOI layer:cobalt layer=5:1. In this experiment, however, the ratio between the SOI layer and the cobalt layer was set to SOI layer:cobalt layer=3:1. Thus, the situation of occurrence of a concave portion by silicide aggregation at the time that the thickness of the cobalt layer is changed from 3 nm to 9 nm upon calculation of the thickness of the SOI layer from the thickness ratio with 10 nm–26 nm as a base, was observed.

Figure 3:
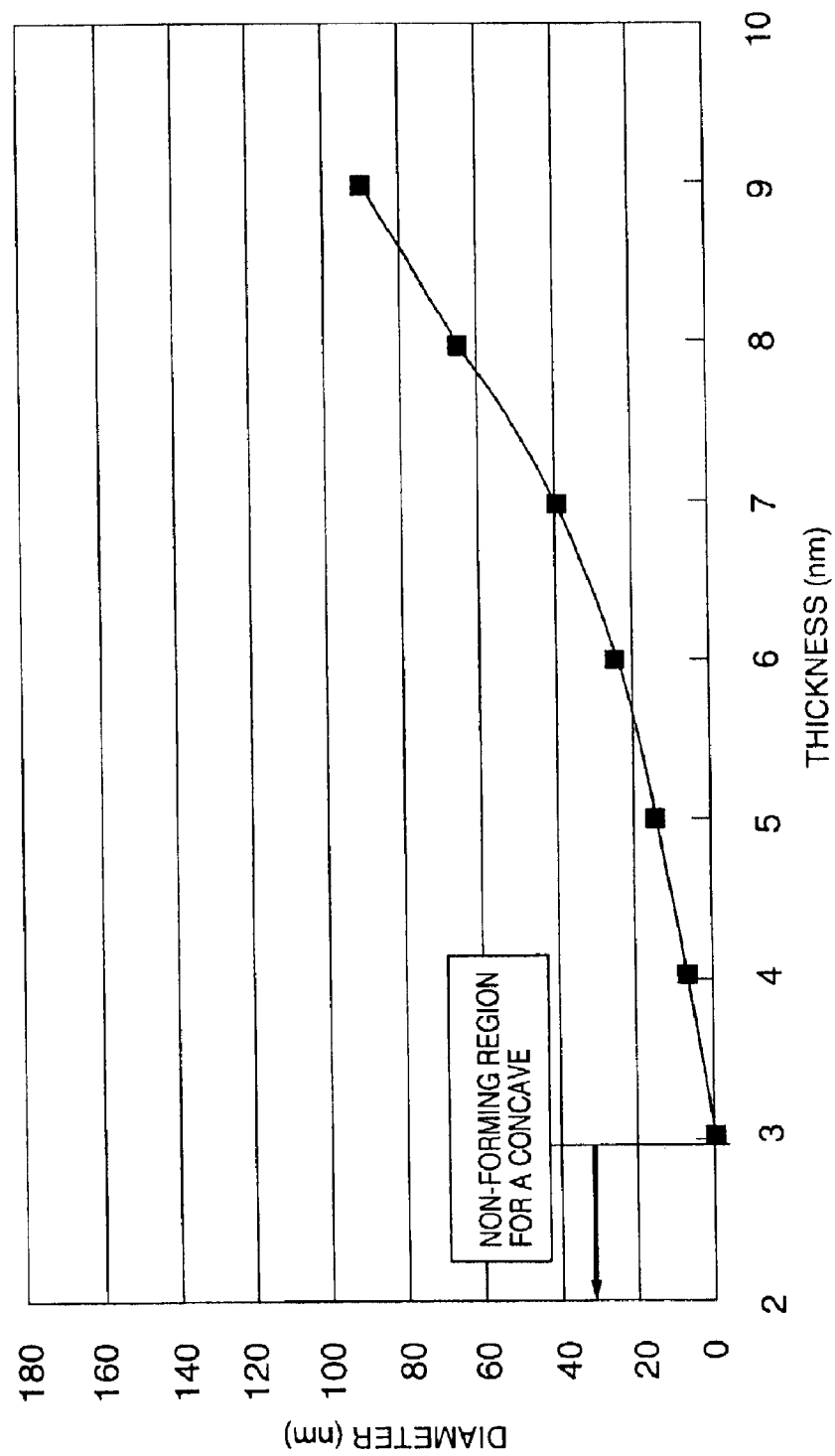
FIG. 3 is a diagram depicting the relationship between the thickness of a cobalt layer and the diameter of a concave portion formed by silicide aggregation.

FIG. 3 is a diagram showing the relationship between the thickness of a cobalt layer and the diameter of a concave portion formed by silicide aggregation. When the thickness of the cobalt layer decreases from 3 nm with 3 nm as the boundary, no concave portion due to the silicide aggregation occurs as is apparent from FIG. 3. The diameter of the concave portion starts to increase in the direction in which the thickness of the cobalt layer becomes thick from 3 nm. When the thickness of the cobalt layer is 9 nm, the diameter of the concave portion shows 90 nm.

It was found from the above experiment that the maximum values of the diameters of the concave portions at the time that the thicknesses of the SOI layer and the cobalt layer were respectively changed, were 120 nm respectively.

This experiment was conducted by adopting the ratio between the thicknesses of an SOI layer and a cobalt layer placed under the condition that silicide aggregation is apt to occur although described even previously. Accordingly, it is needless to say that the maximum value of the diameter of a concave portion obtainable upon SOI layer:cobalt layer= 5:1 corresponding to the ratio between the thicknesses of the normal SOI layer and cobalt layer, becomes smaller than 120 nm.

Thus, even when the maximum value of the diameter of the concave portion is obtained as 120 nm, the present experiment was aimed to establish the dry etching step in which up to the buried oxide film was not etched.

Next, the following experiment was attempted.

It was found from the above experiment that although described previously, the maximum value of the diameter of the concave portion at the time that the thicknesses of the SOI layer and the cobalt layer were changed, was 120 nm. An etching rate relative to $SiO_2$ at a concave portion when the diameter of the concave portion was changed from 0 nm to 150 nm and two types of dry etching gases were used, was measured in consideration of a process margin. The two types of dry etching gases are CHF3/CO (=30/170 sccm) and C4F8/O2/Ar (=20/10/500 sccm). RF power was set to 1600W, pressure was set to 40 mTorr, and an electrode temperature was set to 20° C. An object of the present invention is to establish such a dry etching step as not to effect etching up to a buried oxide film even in the case of the presence of a concave portion formed by silicide aggregation at the bottom of a contact hole in the process of defining the contact hole in an SOI layer having an extra-thin thickness while a contact hole defining step is being satisfied. Accordingly, the measurement was conducted by using such a sample as to define such a contact hole as shown in FIG. 1(d) on the concave portion defined by the silicide aggregation.

Figure 4:
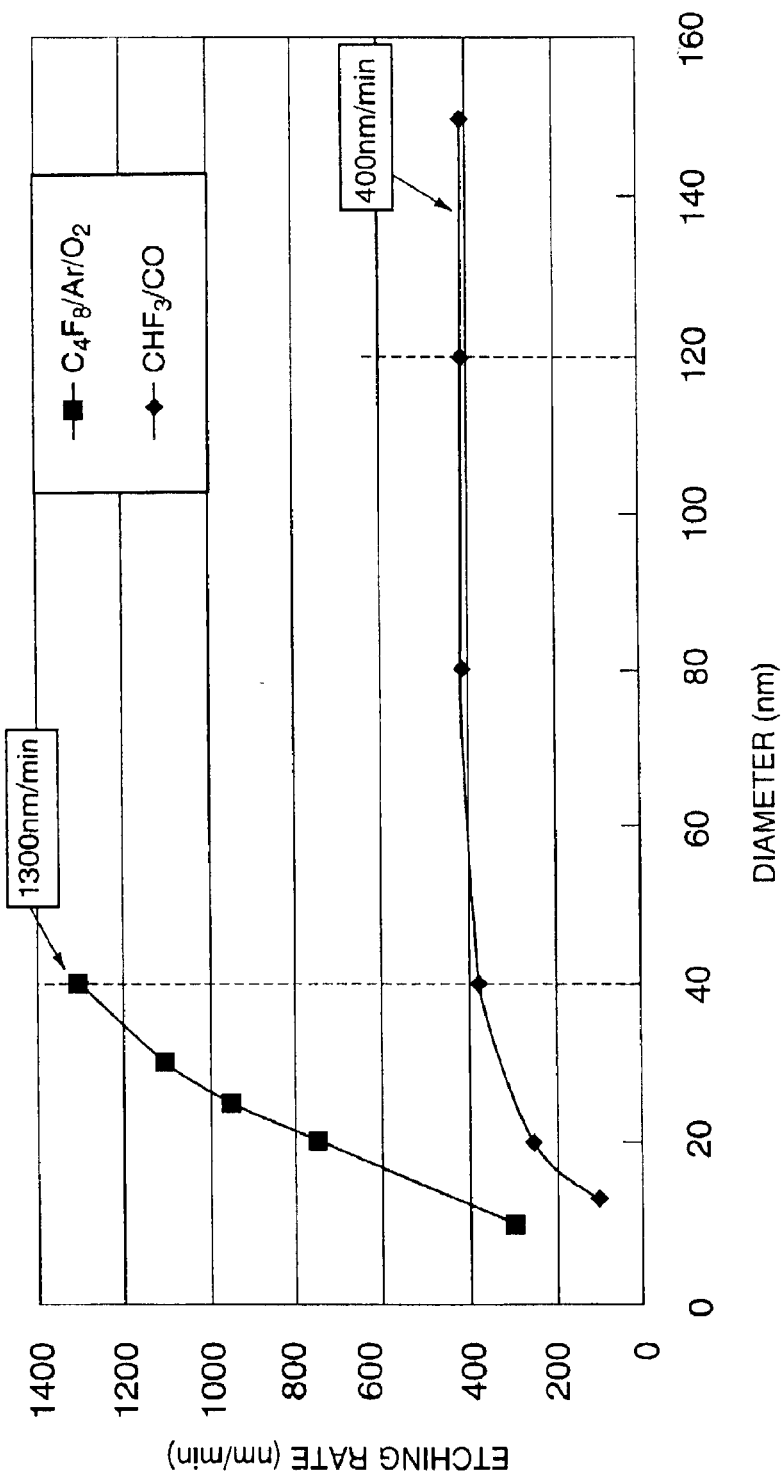
FIG. 4 is a diagram showing the relationship between the diameter of a concave portion formed by silicide aggregation and an etching rate where two types of dry etching gases are used.

The relationship between the diameter of the concave portion formed by silicide aggregation and the etching rate when the two types of dry etching gases are used, is first as follows:

It would be easily understood that when C4F8/O2/Ar is used as the dry etching gas as shown in FIG. 4, the etching rate has already reached 1300 nm/min where the diameter of the concave portion is 40 nm, and hence when a concave portion having a diameter of 120 nm is formed, up to the buried oxide film is etched.

On the other hand, it was found that when CHF3/CO was used as the dry etching gas, as shown in FIG. 4, the etching rate showed about 400 nm/min when the diameter of the concave portion was 40 nm, and the etching rate became substantially constant at about 400 nm/min as viewed in the direction in which the diameter of the concave portion became larger than 40 nm. It is needless to say that the etching rate 400 nm/min is considerably small as compared with the use of C4F8/O2/Ar. The use of CHF3/CO is characterized in that the etching rate does not depend on the diameter of the concave portion and shows a substantially constant value. In other words, since it has been found out that the etching rate becomes constant without depending, on the diameter of the concave portion, control on the depth of etching at the concave portion can be carried out exponentially and simply. Described specifically, the constant etching rate is used and the etching time is suitably set as a setting for an etching condition, whereby the depth of etching on the surface of the buried oxide film can be simply controlled.

In order to achieve the object of the present invention, it is important whether there is no harm in forming the contact hole in the interlayer insulating film when CHF3/CO is used, i.e., a desired contact hole can be defined therein. It was found that when an etching rate 400 nm/min having showed a constant value without depending on the diameter of a concave portion was used, the diameter of a contact hole could be sufficiently formed as shown in FIG. 5.

A proof to allow the achievement of the object of the present invention will be described below.

When a concave portion formed by silicide aggregation exists in the bottom of a contact hole, a CHF3/CO gas in which no etching rate increases, is believed to be suited for restraint on the extension thereof through a buried oxide film by etching. As a mechanism in which there is produced a difference in the etching rate according to gas systems called a CHF3/CO gas and a C4F8/O2/Ar gas, radicals transported to within a contact are believed to differ. The difference in etching rate occurs due to attained ion flux and the difference in ratio between C and F of attained radicals. In the case of the C4F8/O2/Ar gas, many radicals easy to transport F used as an etchant up to the bottom of the contact exist, and C inhibiting etching is attached to the upper portion of the contact, thereby relatively resulting in F rich at the bottom of the contact. Accordingly, an etching rate of a fine hole or a pore connected to the bottom of the contact will increase. In the case of the CHF3/CO gas on the other hand, radicals easy to transport F used as the etchant up to the bottom of the contact do no exist in large numbers as compared with the C4F8/O2/Ar gas. In addition to it, C inhibiting etching is temporarily attached to the upper portion and side walls of the contact but is apt to be transported to the bottom of the contact from the side walls by re-sputter. Accordingly, the proportion of C increases at the bottom of the contact as compared with the C4F8/O2/Ar gas. Thus, there is no observed such a phenomenon that the etching rate of the pore connected to the contact bottom extremely increases. The reason why the etching rate is lowered without being held constant, is that an ion impact effect has decreased.

Even in the case of the semiconductor elemental device using the extra-thin SOI layer as described above, an etching process can be set so that contact etching has a process margin extensively.

Since a CHF3/CO gas was used as a dry etching gas in a method of manufacturing a semiconductor device having an SOI structure, according to the present invention as described above, it was possible to establish such a dry etching step as not to effect etching up to a buried oxide film even in the case of the presence of a concave portion formed by silicide aggregation at the bottom of a contact hole in the process of defining the contact hole in an SOI layer having an extra-thin thickness while a contact hole defining step was being satisfied, as in a fully depleted-SOI device in particular.

While the present invention has been described with reference to the illustrative embodiment, this description is not intended to be construed in a limiting sense. Various modifications of the illustrative embodiment, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor device having an SOI structure, comprising:
    forming a high melting-point metal layer on an entire surface of an SOI layer;
    transforming the high melting-point metal layer and the SOI layer into a metal silicide layer for a source/drain region by heat treatment;
    forming an interlayer insulating film on the metal silicide layer; and
    defining a contact hole in the interlayer insulating film by dry etching to expose a part of the metal silicide layer;
    wherein said dry etching is performed using a $CHF_3/CO$ gas.

2. The method according to claim 1, wherein said semiconductor device is a fully depleted-SOI device.

3. The method according to claim 1, wherein an etching condition is set through the use of a dry etching rate held substantially constant by using the dry etching gas.

4. The method according to claim 3, wherein the etching condition is defined as etching time.

5. The method according to claim 1, wherein the high melting-point metal is cobalt.

6. A method of manufacturing a semiconductor device having an SOI structure, comprising:
    forming a transistor provided with a source region, a drain region and a gate electrode on an SOI layer;
    forming a high melting-point metal layer on the SOI layer located in at least the source region or the drain region;
    transforming the high melting-point metal layer and the SOI layer into a metal silicide layer by heat treatment;
    forming an interlayer insulating film on the metal silicide layer; and
    defining a contact hole in the interlayer insulating film by dry etching to expose a part of the metal silicide layer;
    wherein said dry etching is carried out using a $CHF_3/CO$ gas.

7. The method according to claim 6, wherein said semiconductor device is a fully depleted-SOI device.

8. The method according to claim 6, wherein an etching condition is set through the use of a dry etching rate held substantially constant by use of the dry etching gas.

9. The method according to claim 8, wherein the etching condition is defined as etching time.

10. The method according to claim 6, wherein the high melting-point metal is cobalt.

11. A method of manufacturing a semiconductor device having an SOI structure, comprising:
    forming a high melting-point metal layer on an entire surface of an SOI layer;
    transforming the high melting-point metal layer and the SOI layer into a metal silicide layer by heat treatment;
    forming an interlayer insulating film on the metal silicide layer; and
    defining a contact hole in the interlayer insulating film by dry etching to expose a part of the metal silicide layer;
    wherein said dry etching is carried out using such a dry etching gas as to satisfy an open diameter of the contact hole and suppress etching from a concave portion formed at the bottom of the contact hole by the metal silicide layer transforming step to a buried oxide film.

12. The method according to claim 11, wherein said dry etching is performed using CHF3/CO.

13. The method according to claim 11, wherein said semiconductor device is a fully depleted-SOI device.

14. The method according to claim 11, wherein an etching condition is set through the use of a dry etching rate held substantially constant by use of the dry etching gas.

15. The method according to claim 14, wherein the etching condition is defined as etching time.

16. The method according to claim 11, wherein the high melting-point metal is cobalt.

17. A method of manufacturing a semiconductor device having an SOI structure, comprising:

forming a high melting-point metal layer on an entire surface of an SOI layer;

transforming the high melting-point metal layer and the SOI layer into a metal silicide layer by heat treatment;

forming an interlayer insulating film on the metal silicide layer; and defining a contact hole in the interlayer insulating film by dry etching to expose a part of the metal silicide layer;

wherein said dry etching makes use of a $CHF_3/CO$ gas and a dry etching rate is held substantially constant by use of the $CHF_3/CO$ gas.

18. The method according to claim 17, wherein an etching condition is set through the use of the dry etching rate held substantially constant.

19. The method according to claim 18, wherein the etching condition is defined as etching time.

20. The method according to claim 17, wherein said semiconductor device is a fully depleted-SOI device.

21. The method according to claim 17, wherein the high melting-point metal is cobalt.

* * * * *